United States Patent
Morishita

(10) Patent No.: US 7,456,440 B2
(45) Date of Patent: Nov. 25, 2008

(54) ELECTROSTATIC PROTECTION DEVICE

(75) Inventor: Yasuyuki Morishita, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 55 days.

(21) Appl. No.: 11/110,834

(22) Filed: Apr. 21, 2005

(65) Prior Publication Data
US 2005/0236674 A1    Oct. 27, 2005

(30) Foreign Application Priority Data
Apr. 23, 2004  (JP)  ............... 2004-127787

(51) Int. Cl.
*H01L 29/74*  (2006.01)
(52) U.S. Cl. ............... 257/173; 257/E29.217
(58) Field of Classification Search ......... 257/107, 257/173, 213, 288, 355, 356, 357, 358, 359, 257/360, 361, 362, 378, E29.211, E29.217
See application file for complete search history.

(56) References Cited

U.S. PATENT DOCUMENTS

| | | | | |
|---|---|---|---|---|
| 4,454,648 A | * | 6/1984 | Hsia | ............... 438/216 |
| 6,281,554 B1 | * | 8/2001 | Pan | ............... 257/357 |
| 6,713,818 B2 | * | 3/2004 | Kodama | ............... 257/362 |
| 6,806,160 B2 | * | 10/2004 | Ker et al. | ............... 438/371 |

2002/0079538 A1    6/2002  Su et al.

FOREIGN PATENT DOCUMENTS

| | | |
|---|---|---|
| JP | 9-191082 | 7/1997 |
| JP | 11-274404 | 10/1999 |
| JP | 2000-188389 | 7/2000 |
| JP | 2001-144191 | 5/2001 |

OTHER PUBLICATIONS

Japanese Office Action dated Mar. 25, 2008, with English translation.
Japanese Office Action dated Jun. 17, 2008, with partial English translation.

* cited by examiner

*Primary Examiner*—A. Sefer
*Assistant Examiner*—Kevin Quinto
(74) *Attorney, Agent, or Firm*—McGinn IP Law Group, PLLC

(57) ABSTRACT

The electrostatic protection device comprises a semiconductor substrate of a first conductivity type, a well of a second conductivity type formed on the semiconductor substrate, a first diffusion layer of the first conductivity type formed on the second conductivity type well and connected to a signal terminal, a first well of the first conductivity type formed on the semiconductor substrate, a first diffusion layer of the second conductivity type formed on the first well and connected to a ground terminal, a second well of the first conductivity type formed on the semiconductor substrate and spaced apart from the first well and a second diffusion layer of the first conductivity type formed on the second well connected to a ground terminal.

17 Claims, 5 Drawing Sheets

ELECTROSTATIC PROTECTION DEVICE

BACKGROUND OF THE INVENTION

1. Field of the Invention

The present invention relates to electrostatic protection devices for preventing the electrostatic breakdown of protected circuits composed of semiconductor integrated circuits.

2. Description of Related Art

Semiconductor integrated circuits generally have an electrostatic protection device for preventing the breakdown of internal circuits due to electrostatic discharge (ESD) generated during LSI fabrication or LSI packaging on a board.

FIG. 6 shows the structure of a conventional electrostatic protection device, and FIG. 7 is an equivalent circuit diagram for the same. This conventional electrostatic protection device is a thyristor-type electrostatic protection device having a configuration like that of the electrostatic protection circuit disclosed in FIG. 7 of U.S. Patent Application Publication No. 2002-79538 A1 (Yuan-Mou Su, et al.).

Referring to FIG. 6, a P-type semiconductor substrate PS11 has formed on an upper face side thereof an N-type well NW11 and a P-type well PW11. Although FIG. 7 of Yuan-Mou Su et al. does not show a P-type well PW11, since the formation of a P-type well PW11 is critical to the configuration of the device, such a P-type well PW11 is shown in the example illustrated in FIG. 6.

The N-type well NW11 has formed, on an upper face side thereof, a first $N^+$ diffusion layer ND11 and a first $P^+$ diffusion layer PD11 which are spaced apart. The first $N^+$ diffusion layer ND11 and the first $P^+$ diffusion layer PD11 are connected to a signal pad. Likewise, the P-type well PW11 has formed, on an upper face side thereof, a second $N^+$ diffusion layer ND12 and a second $P^+$ diffusion layer PD12 which are spaced apart. The second $N^+$ diffusion layer ND 12 is connected to a ground terminal, and the second $P^+$ diffusion layer PD12 is connected through an external resistance $R_A$ to the ground terminal. This second $P^+$ diffusion layer PD12 has been provided for the purpose of fixing the substrate potential.

As shown in the equivalent circuit in FIG. 7, this conventional electrostatic protection device has a PNP transistor Tr11 and an NPN transistor Tr12.

The PNP transistor Tr11 and the NPN transistor Tr12 together make up a thyristor, with the first $P^+$ diffusion layer PD11 serving as the thyristor anode and the second $N^+$ diffusion layer ND12 serving as the thyristor cathode. In this thyristor construction, when a voltage drop occurs at the external resistance $R_A$ due to a breakdown current generated by breakdown of the PN junction between the N-type well NW11 and the P-type well PW11, a forward bias is applied between the base and emitter of the NPN transistor Tr12, turning on the NPN transistor Tr12. Turn-on of the NPN transistor actuates the thyristor. The higher the resistance value of the external resistance $R_A$, the lower the breakdown current at which the prescribed given voltage drop arises, enabling stable thyristor operation to be achieved.

With the conventional electrostatic protection device shown in FIG. 6, when a substrate potential fixing $P^+$ diffusion layer PD13 formed for another device is situated nearby, the resistance $R_{pw}$ between the substrate potential fixing $P^+$ diffusion layer PD13 and the P-type well PW11 is small and so the external resistance $R_A$ ceases to function. Operation by the electrostatic protection device thus becomes unstable. To prevent such a problem from arising, a large spacing must be provided between the electrostatic protection device and the substrate potential fixing $P^+$ diffusion layer PD13 for the other device. This essentially means that the electrostatic protection device occupies a larger surface area, which results in the semiconductor integrated circuit having a relatively large chip size.

SUMMARY OF THE INVENTION

According to one aspect of the present invention, there is provided an electrostatic protection device for preventing breakdown of a protected circuit due to electrostatic discharge. The electrostatic protection device comprises a semiconductor substrate of a first conductivity type, a well of a second conductivity type formed on the semiconductor substrate, a first diffusion layer of the first conductivity type formed on the second conductivity type well and connected to a signal terminal, a first well of the first conductivity type formed on the semiconductor substrate, a first diffusion layer of the second conductivity type formed on the first well and connected to a ground terminal, a second well of the first conductivity type formed on the semiconductor substrate and spaced apart from the first well and a second diffusion layer of the first conductivity type formed on the second well connected to a ground terminal.

In the electrostatic protection device according to the present invention, the formation of a resistance between the first well and the second well results in a voltage drop, facilitating turn-on of a transistor and enabling stable thyristor operation to be achieved. Moreover, with this type of configuration, even if a substrate potential fixing diffusion layer of the first conductivity type formed for another device is situated nearby, thyristor operation does not change. Hence, a substrate potential fixing diffusion layer of the first conductivity type can be placed nearby, making it possible to reduce the surface area occupied by the electrostatic protection device.

According to another aspect of the present invention, there is provided an electrostatic protection device comprising a thyristor structure provided on a P-type semiconductor substrate by a PNP transistor in which a $P^+$ diffusion layer disposed within an N-type well serves as an emitter, the N-type well serves as a base and a first P-type well serves as a collector, and by an NPN transistor in which an $N^+$ diffusion layer disposed within the first P-type well serves as an emitter, the first P-type well serves as a base and the N-type well serves as a collector, wherein the device further comprises a second substrate potential fixing P-type well provided spaced apart from the first P-type well.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
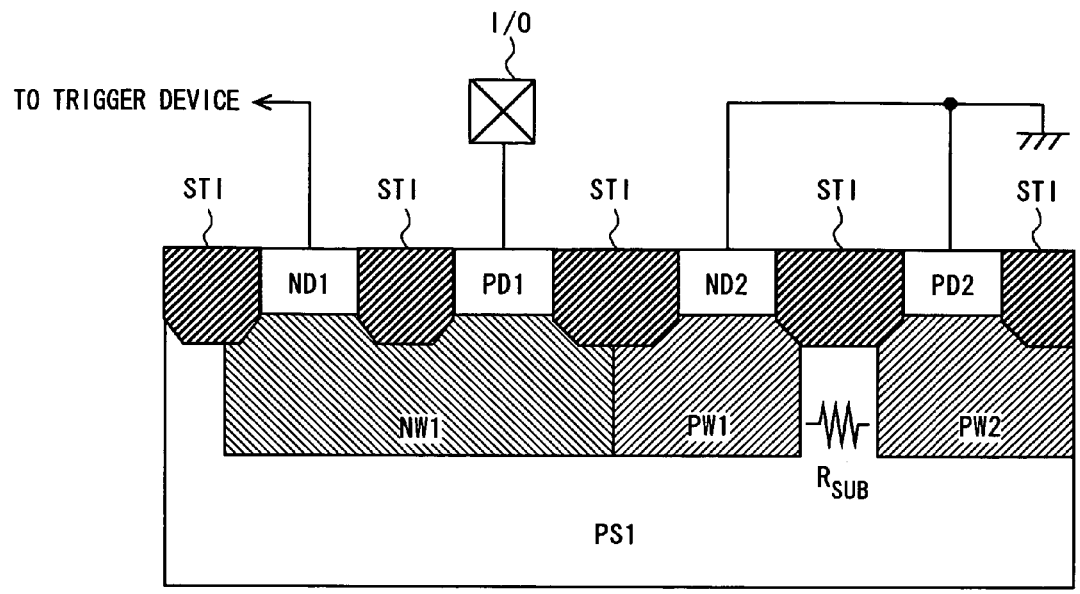
FIG. 1 is a sectional view showing a structure of the electrostatic protection device according to the first embodiment of the present invention.
Figure 2:
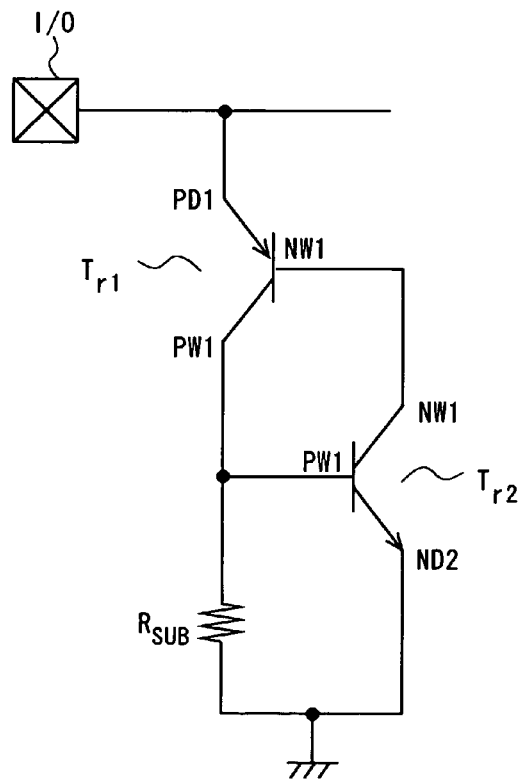
FIG. 2 is an equivalent circuit diagram of the electrostatic protection device according to the first embodiment of the present invention.

FIG. 1 shows the structure of an electrostatic protection device according to the invention, and FIG. 2 is the equivalent circuit diagram. The inventive electrostatic protection device is a thyristor-type electrostatic protection device.

Referring to FIG. 1, this electrostatic protective device has formed, on an upper face side of a P-type semiconductor substrate PS1: an N-type well NW1, a first P-type well PW1 and a second P-type well PW2. The N-type well NW1, first P-type well PW1 and second P-type well PW2 are selectively formed by a suitable technique such as ion implantation.

The N-type well NW1 and the first P-type well PW1 are mutually contiguous, but the first P-type well PW1 and the second P-type well PW2 are formed so as to be spaced apart. The first P-type well PW1 and the second P-type well PW2 have a region therebetween which is of the same composition as the P-type semiconductor substrate PS1.

In this embodiment of the invention, the P-type semiconductor substrate PS1 has an impurity concentration of about $10^{15}$ cm$^{-3}$, whereas the first and second P-type wells PW1 and PW2 have impurity concentrations of about $10^{17}$ cm$^{-3}$.

Therefore, a resistance $R_{SUB}$ between the first P-type well PW1 and the second P-type well PW2 has a higher resistance value than the parasitic resistance $R_{PW}$ between the substrate potential fixing P$^+$ diffusion layer PD13 and the P-type well PW11. In conventional electrostatic protection devices, an external resistance has been provided between the substrate potential fixing P$^+$ diffusion layer and the grounding terminal so as to facilitate NPN transistor turn-on and thyristor operation. By contrast, in the electrostatic protection device of the invention, the resistance $R_{SUB}$ is built into the silicon forming the integrated circuit.

On the upper face side of the N-type well NW1, a first N$^+$ diffusion layer ND1 and a first P$^+$ diffusion layer PD1 are formed so as to be mutually spaced apart by a suitable technique such as ion implantation. In FIG. 1, the first N$^+$ diffusion layer ND1 is connected to a trigger device, although this first N$^+$ diffusion layer ND1 may instead be connected to a signal pad input/output (I/O). The first P$^+$ diffusion layer PD1 is connected to a signal pad (signal terminal).

The first P-type well PW1 has formed on an upper face side thereof a second N$^+$ diffusion layer ND2. This second N$^+$ diffusion layer ND2 is connected to a ground terminal. Since the second N$^+$ diffusion layer ND2 is covered by the first P-type well PW1, the base resistance of the NPN transistor Tr2 can be lowered, enabling thyristor performance to be enhanced.

The second P-type well PW2 has formed on an upper face side thereof a second P$^+$ diffusion layer PD2. This second P$^+$ diffusion layer PD2 is provided for the purpose of fixing the substrate potential, and is connected by wire to the ground terminal. Unlike the conventional example shown in FIG. 6, an external resistance is not provided between the second P$^+$ diffusion layer PD2 and the ground terminal.

The first N$^+$ diffusion layer ND1, first P$^+$ diffusion layer PD1, second N$^+$ diffusion layer ND2 and second P$^+$ diffusion layer PD2 are dielectrically isolated from each other by shallow trench isolation-type device isolating dielectric films STI.

A PNP transistor Tr1 is composed of the first P$^+$ diffusion layer PD1 as the emitter, the N-type well NW1 as the base, and the first P-type well PW1 as the collector. An NPN transistor Tr2 is composed of the first N$^+$ diffusion layer ND2 as the emitter, the first P-type well PW1 as the base, and the N-type well NW1 as the collector.

In the electrostatic protection device constructed as shown in FIGS. 1 and 2, the formation of a resistance $R_{SUB}$ between the first P-type well PW1 and the second P-type well PW2 results in a voltage drop, facilitating turn-on of the NPN transistor and enabling stable thyristor operation to be achieved.

Moreover, with this type of configuration, even if a substrate potential fixing P$^+$ diffusion layer PD formed for another device is situated nearby, thyristor operation does not change. Hence, a substrate potential fixing P$^+$ diffusion layer PD can be placed nearby, making it possible to reduce the surface area occupied by the electrostatic protection device. For example, when a thyristor protection device is formed using 90 nm CMOS technology, in the conventional example, the protection device would have to occupy a surface area of about 2,000 μm$^2$ to ensure the requisite ESD tolerance (at least 2,000 V, HBM test), whereas in the present invention, this surface area can be reduced to about 500 μm$^2$.

The base NW1 of the PNP transistor Tr1 in FIG. 2 is connected to a signal pad I/O or a trigger device. If it is connected to a trigger device, the trigger device may have any of various configurations.

Second Embodiment

Figure 3:
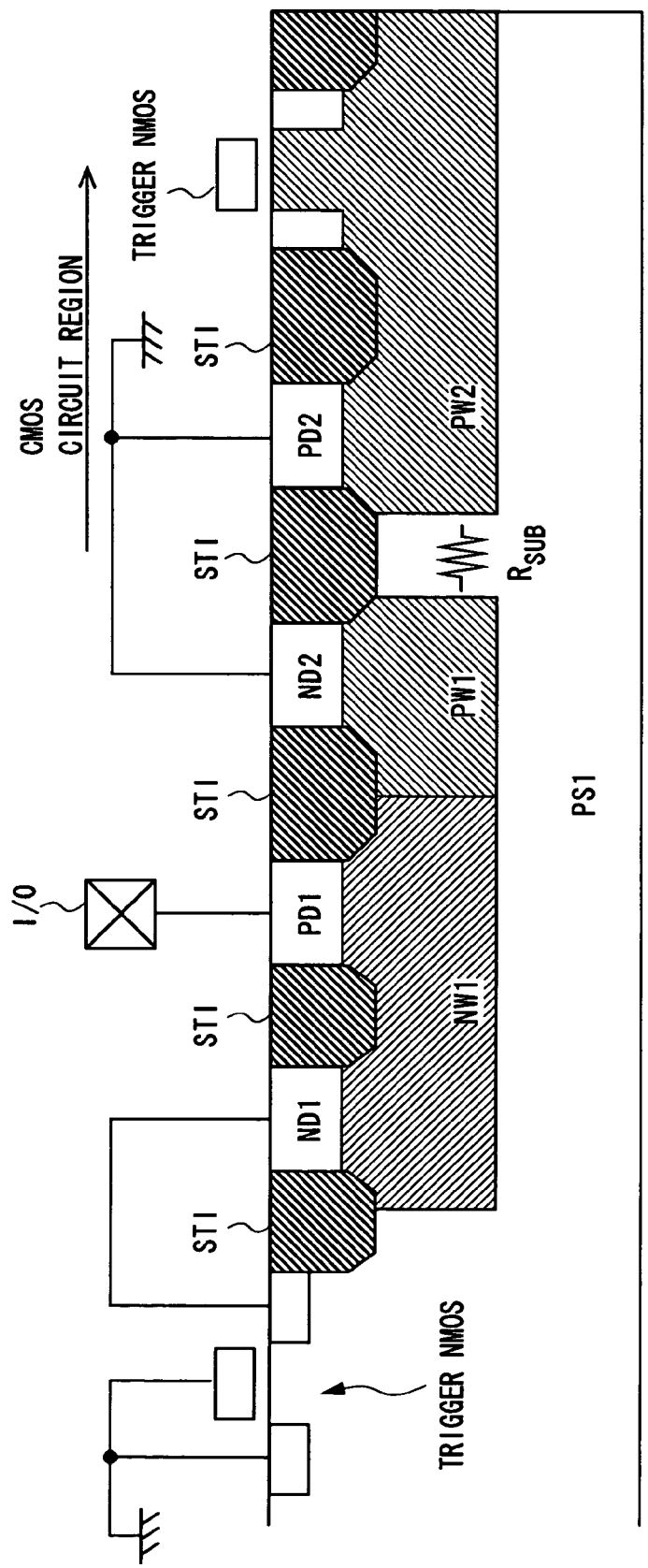
FIG. 3 is a sectional view showing a structure of the electrostatic protection device according to the second embodiment of the present invention.
Figure 4:
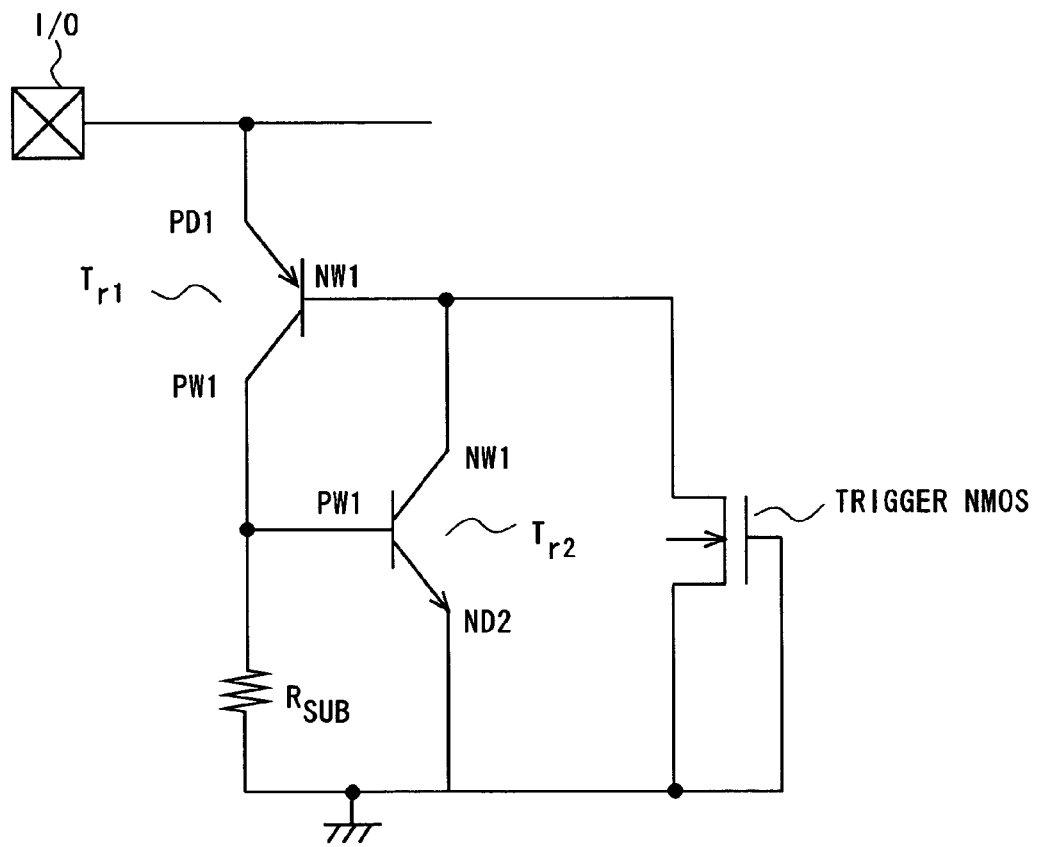
FIG. 4 is an equivalent circuit diagram of the electrostatic protection device according to the second embodiment of the present invention.

FIG. 3 is a view showing the structure of an electrostatic protection device according to the second embodiment of the invention. In FIG. 3, the same elements as in FIG. 1 are denoted by the same reference symbols and redundant description is omitted. FIG. 4 shows an equivalent circuit of the electrostatic protection device shown in FIG. 3.

The second embodiment is described below, mainly on a difference from the first embodiment.

Referring to FIG. 3, a CMOS circuit, such as NMOS Tr in FIG. 3, is formed in the P-type well PW2. Thus, the P-type well PW2 is not exclusively used for a protection circuit. The P-type impurity domain PD2 is placed for connecting the P-type well PW2 for the CMOS circuit to the ground. Thus, the P-type impurity domain PD2 is also not exclusively used for a protection circuit.

Figure 6:
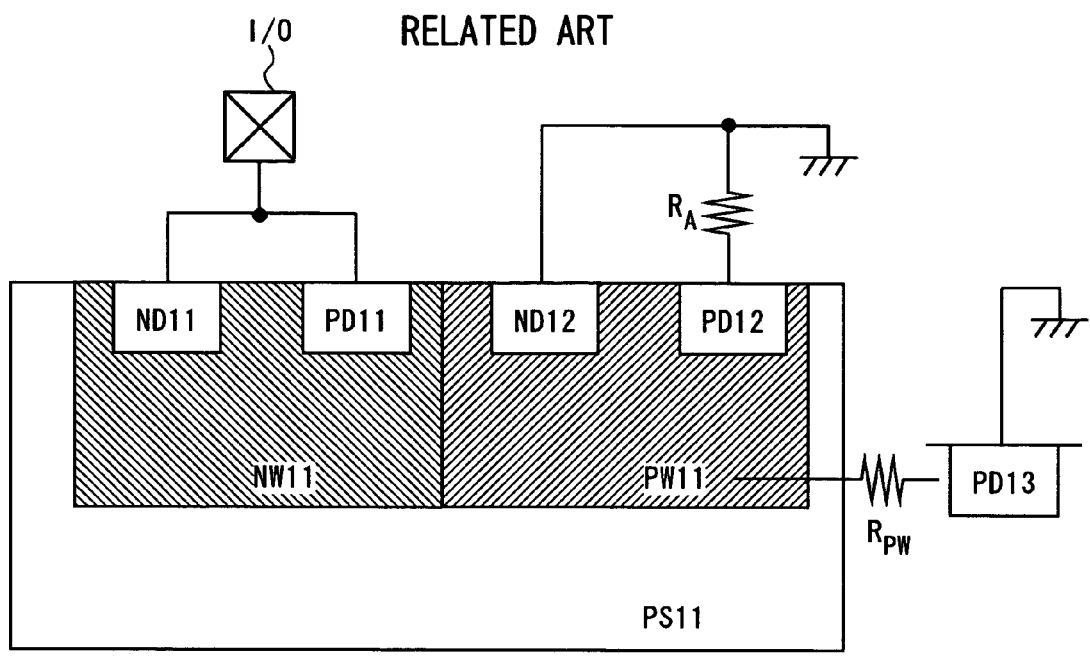
FIG. 6 is a sectional view showing a structure of the conventional electrostatic protection device.
Figure 7:
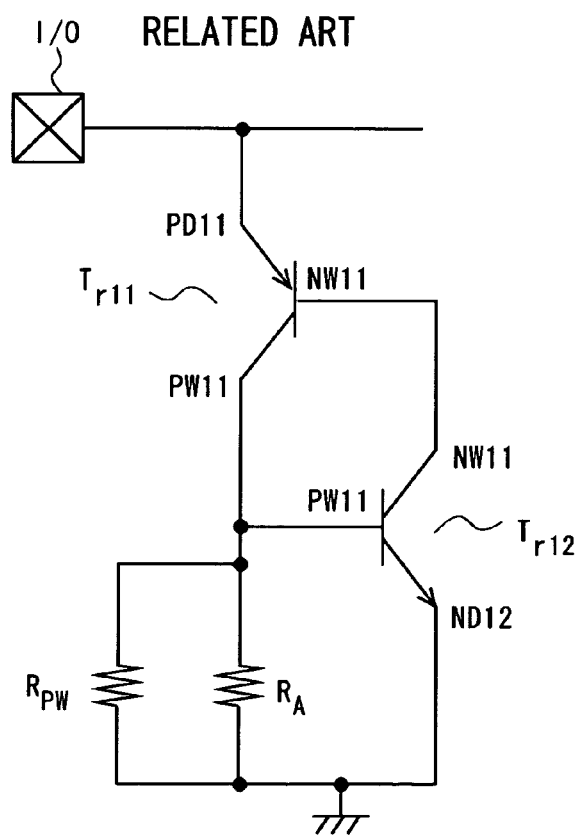
FIG. 7 is an equivalent circuit diagram of the conventional electrostatic protection device.

In the related art shown in FIG. 6, the N-type impurity domain ND12 and the P-type impurity domain PD12 are formed in the P-type well PW11 as the base of the NPN bipolar transistor Tr12. The two domains are connected to the ground terminal.

On the other hand, in the present invention shown in FIG. 3, no P-type impurity domain is formed in the P-type well PW1 as the base of the NPN bipolar transistor Tr2. Only the N-type impurity domain ND2 is formed in the P-type well PW1 and connected to the ground terminal.

Referring then to FIG. 4, the operation of the protection circuit of the present invention is described hereinafter.

When a serge voltage is applied to the I/O pad, a high voltage is applied between the source and the drain of the trigger NMOS Tr via the PD1 and NW1, causing the trigger NMOS Tr to break down. Then, a base current of the PNP bipolar transistor Tr1 flows and the transistor Tr1 turns on so that the collector-source current of the transistor Tr1 flows. A voltage drop of parasitic resistance $R_{sub}$ thereby occurs and the base voltage of the NPN bipolar transistor Tr2 increases so that the base current flows. The transistor Tr2 thereby turns on. In this way, the transistors Tr1 and Tr2 both turn on and a current flows from the I/O pad to the ground, thus functioning as a protection circuit.

Third Embodiment

Figure 5:
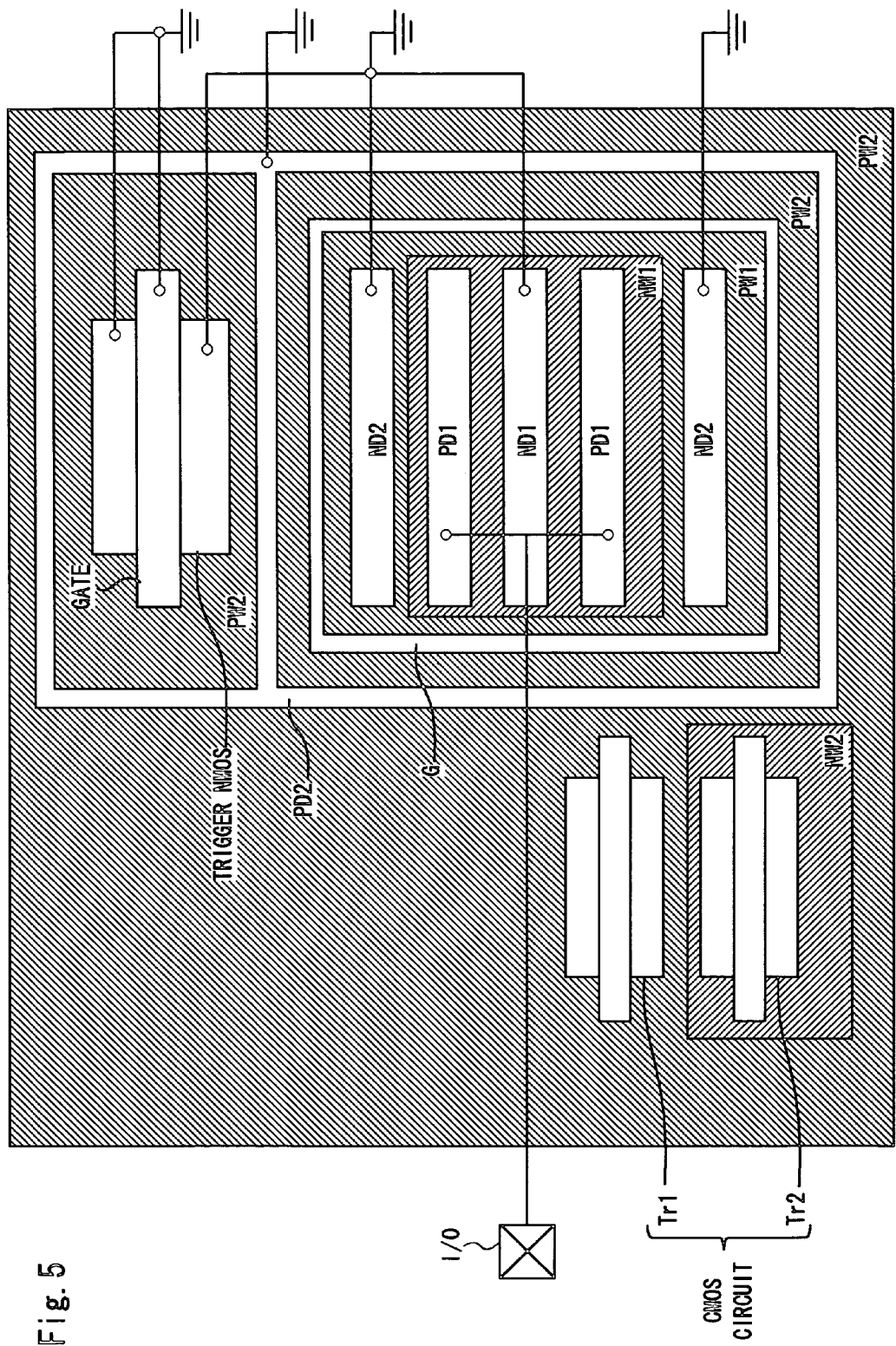
FIG. 5 is a plan view showing a structure of the electrostatic protection device according to the third embodiment of the present invention.

FIG. 5 is a view showing the structure of an electrostatic protection device according to the third embodiment of the invention. The structure of FIG. 5 does not have a STI region. In FIG. 5, the same elements as in FIG. 3 are denoted by the same reference symbols and detailed description is omitted.

As shown in FIG. 5, the P-type well PW1 surrounds the N-type well NW1. Further, the P-type well PW2 surrounds the P-type well PW1 and the N-type well NW1. The P-type well PW1 and the P-type well PW2 are separated from each other by a gap G. The gap G surrounds the N-type well NW1 and the P-type well PW1. The substrate resistance of the gap G serves as the parasitic resistance $R_{sub}$.

The P-type impurity domain PD2 formed in the P-type well PW2 is formed in a ring and surrounds the P-type well PW1 and the N-type well NW1.

Further, a pair of P-type impurity domains PD1 is formed in both sides of the N-type impurity domain ND1. The two P-type impurity domains PD1 are both connected to the I/O pad.

In the P-type well PW2 outside the ring-shaped P-type impurity domain PD2, the NMOS transistor Tr1 constituting the CMOS circuit is placed. Also in the P-type well PW2 outside the ring-shaped P-type impurity domain PD2, the N-type well NW2 is placed. In the N-type well NW2, the PMOS transistor Tr2 constituting the CMOS circuit is placed. The CMOS circuit composed of the NMOS transistor Tr1 and the PMOS transistor Tr2 forms a logic circuit, for example.

It is apparent that the present invention is not limited to the above embodiment and it may be modified and changed without departing from the scope and spirit of the invention.

What is claimed is:

1. An electrostatic protection device for preventing breakdown of a protected circuit due to electrostatic discharge, comprising:
    a semiconductor substrate of a first conductivity type;
    a well of a second conductivity type formed on the semiconductor substrate;
    a first diffusion layer of the first conductivity type formed on the second conductivity type well and connected to a signal terminal;
    a first well of the first conductivity type formed on the semiconductor substrate;
    a first diffusion layer of the second conductivity type formed on the first well and connected to a ground terminal;
    a second well of the first conductivity type formed on the semiconductor substrate and spaced apart from the first well; and
    a second diffusion layer of the first conductivity type formed on the second well connected to a ground terminal,
    wherein a region between the first well and the second well is of the first conductivity type and has a lower impurity concentration than the first well and the second well.

2. The electrostatic protection device of claim 1, wherein the first conductivity type is P-type, and the second conductivity type is N-type.

3. The electrostatic protection device of claim 1, wherein a region between the first well and the second well is of the same composition as the semiconductor substrate of the first conductivity type.

4. An electrostatic protection device as in claim 1, wherein the first diffusion of the second conductivity type is the only diffusion layer formed on the first well of the first conductivity type.

5. An electrostatic protection device as in claim 1, wherein only diffusions of the second conductivity type are formed on the first well of the first conductivity type.

6. An electrostatic protection device as in claim 1,
    wherein the second well of the first conductivity type is spaced apart from the first well so as to form a resistance between the first well and the second well that results in a voltage drop facilitating transistor turn-on and enabling stable thyristor operation.

7. An electrostatic protection device as in claim 1, wherein all of the first diffusion layer of the first conductivity type, the first diffusion layer of the second conductivity type, and the second diffusion layer of the first conductivity type are disposed within one of the first well and the second well.

8. A silicon structure of an electrostatic protection device for preventing breakdown of a protected circuit due to electrostatic discharge, the silicon structure comprising:
    a semiconductor substrate of a first conductivity type;
    a well of a second conductivity type formed on the semiconductor substrate;
    a first diffusion layer of the first conductivity type formed on the second conductivity type well and connected to a signal terminal;
    a first well of the first conductivity type formed on the semiconductor substrate;
    a first diffusion layer of the second conductivity type formed on the first well and connected to a ground terminal;
    a second well of the first conductivity type fanned on the semiconductor substrate and separated from the first well by a structure of the first conductivity type which provides a resistance internal to the silicon structure between the first well and the second well; and
    a second diffusion layer of the first conductivity type formed on the second well and connected to a ground terminal.

9. A silicon structure of an electrostatic protection device as in claim 8, wherein the first diffusion layer of the second conductivity type is the only diffusion layer formed on the first well of the first conductivity type.

10. A silicon structure of an electrostatic protection device as in claim 8, wherein diffusion layers only of the second conductivity type are formed on the first well of the first conductivity type.

11. A silicon structure of an electrostatic protection device as in claim 8, wherein the resistance internal to the silicon structure results in a voltage drop facilitating transistor turn-on and enabling stable thyristor operation.

12. An electrostatic protection device for preventing breakdown of a protected circuit due to electrostatic discharge, comprising:
- a semiconductor substrate of a first conductivity type;
- a well of a second conductivity type formed on the semiconductor substrate;
- a first diffusion layer of the first conductivity type formed on the second conductivity type well and connected to a signal terminal;
- a first well of the first conductivity type formed on the semiconductor substrate;
- a first diffusion layer of the second conductivity type formed on the first well and connected to a ground terminal;
- a second well of the first conductivity type formed on the semiconductor substrate and spaced apart from the first well; and
- a second diffusion layer of the first conductivity type formed on the second well connected to a ground terminal,
- wherein the second well of the first conductivity type is spaced apart from the first well so as to form a resistance between the first well and the second well that results in a voltage drop facilitating transistor turn-on and enabling stable thyristor operation.

13. The electrostatic protection device of claim 12, wherein the first conductivity type is P-type, and the second conductivity type is N-type.

14. The electrostatic protection device of claim 12, wherein a region between the first well and the second well is of the first conductivity type and has a lower impurity concentration than the first well and the second well.

15. The electrostatic protection device of claim 12, wherein a region between the first well and the second well is of the same composition as the semiconductor substrate of the first conductivity type.

16. An electrostatic protection device as in claim 12, wherein the first diffusion of the second conductivity type is the only diffusion layer formed on the first well of the first conductivity type.

17. An electrostatic protection device as in claim 12, wherein only diffusions of the second conductivity type are formed on the first well of the first conductivity type.

* * * * *